United States Patent [19]

Minuhin et al.

[11] Patent Number: 5,682,125

[45] Date of Patent: *Oct. 28, 1997

[54] ADAPTIVE ANALOG TRANSVERSAL EQUALIZER

[75] Inventors: Vadim B. Minuhin; Vladimir Kovner, both of Oklahoma City; Srinivasan Surendran, Norman, all of Okla.

[73] Assignee: Seagate Technology, Inc., Scotts Valley, Calif.

[*] Notice: The term of this patent shall not extend beyond the expiration date of Pat. No. 5,592,340.

[21] Appl. No.: 536,008

[22] Filed: Sep. 29, 1995

Related U.S. Application Data

[63] Continuation-in-part of Ser. No. 309,912, Sep. 21, 1994, Pat. No. 5,592,340.

[51] Int. Cl.[6] .................... H04B 3/04; H03H 15/00
[52] U.S. Cl. .................. 333/18; 333/28 R; 333/166
[58] Field of Search ............................ 333/18, 28 R, 333/28 T, 138, 139, 166

[56] References Cited

U.S. PATENT DOCUMENTS

| | | | |
|---|---|---|---|
| 3,202,769 | 8/1965 | Coleman, Jr. | 333/139 X |
| 4,146,840 | 3/1979 | McRae et al. | 333/18 X |
| 4,335,396 | 6/1982 | Rzeszewski | 348/614 |
| 4,346,412 | 8/1982 | Conley | 360/46 |
| 4,564,869 | 1/1986 | Baumeister | 360/46 |
| 4,701,714 | 10/1987 | Agoston | 333/138 X |
| 4,799,112 | 1/1989 | Bremmer et al. | 360/31 |
| 4,894,734 | 1/1990 | Fischler et al. | 360/51 |
| 4,961,160 | 10/1990 | Sato et al. | 364/724.01 |
| 5,060,088 | 10/1991 | Dolivo et al. | 360/46 |
| 5,087,992 | 2/1992 | Dahandeh et al. | 360/31 |
| 5,153,875 | 10/1992 | Takatori | 370/32.1 |
| 5,220,466 | 6/1993 | Coker et al. | 360/46 |
| 5,237,464 | 8/1993 | Cronch et al. | 360/46 |
| 5,325,130 | 6/1994 | Miller et al. | 348/614 |
| 5,357,224 | 10/1994 | Sterzer | 333/166 X |
| 5,392,171 | 2/1995 | Kovner et al. | 360/65 |

OTHER PUBLICATIONS

"Active Filter Design Using Operational Transconductance Amplifiers: A Tutorial"; by R.L. Geiger et al.; pp. 20–32; Mar. 1995; *IEEE Circuits and Devices Magazine,* vol. 1 No. 2 (ISSN 8755–3996).

"Adaptive Continuous–Time Equalization and FDTS/DF Sequence Detection;" Kimberly C. Bracken et al.; pp. 3048–3050; Nov. 1995; *IEEE Transactions on Magnetics,* vol. 31, No. 6.

"Adaptive Equalization of Highly Dispersive Channels for Data Transmission;" by Allen Gersho; pp. 55–70; Jan. 1969; *The Bell System Technical Journal.*

"A PRML System for Digital Magnetic Recording"; by Roy D. Cideciyan, Francois Dolivo, et al.; pp. 38–56; Jan. 1992; *IEEE Journal on Selected Areas in Communications,* vol. 10, No. 1.

(List continued on next page.)

*Primary Examiner*—Benny Lee
*Assistant Examiner*—Justin P. Bettendorf
*Attorney, Agent, or Firm*—Bill D. McCarthy; Edward P. Heller, III; Randall K. McCarthy

[57] ABSTRACT

An analog, adaptive generalized transversal equalizer for use in the filtering system of a disc drive PRML read channel, the transversal equalizer employing the use of non-ideal delay elements. The filtering system comprises the equalizer connected in series with an adaptive, analog prefilter. The prefilter is comprised of a plurality of serially connected, adaptive, analog filter stages having variable transfer functions determined by adaptive parameter signals received by the filter stages. The generalized transversal equalizer comprises a plurality of serially connected, adaptive, analog low pass filters, having taps on either side of each low pass filter, a plurality of multipliers that receive signals at the tap locations of the delay circuit, and a summing circuit that receives the outputs of the multipliers. The transfer functions of the delay circuit are continuously variable in relation to adaptive parameter signals received by the delay circuit and the coefficients of multiplication are variable in relation to the adaptation process.

8 Claims, 5 Drawing Sheets

OTHER PUBLICATIONS

"Choosing the right PRML read channel"; by Ed Healy; pp. 27–34; Nov./Dec. 1995; *Data Storage*.

"Comparison of Different Detection Techniques for Digital Magnetic Recording Channels;" by Ke Han et al.; pp. 1–6; Mar. 1995; *IEEE Transactions on Magnetics*, vol. 31, No. 2.

*Data Communications Principles;* by Richard D. Gitlin, et al.; pp. 488–509; 1992. No month.

"Implementation of PRML in a Rigid Disk Drive;" by J.D. Coker et al.; pp. 4538–4543; Nov. 1991; *IEEE Transactions on Magnetics*, vol. 27, No. 6.

"Partial Response Signaling;" by Peter Kabal et al.; pp. 921–934; Sep., 1975; *IEEE Transactions on Communications*, vol. Com. 23, No. 9.

"Performance Evaluation of The Disk Drive Industry's Second Generation PRML Data Channel;" by G. Kerwin, et al.; 4 pages. no date.

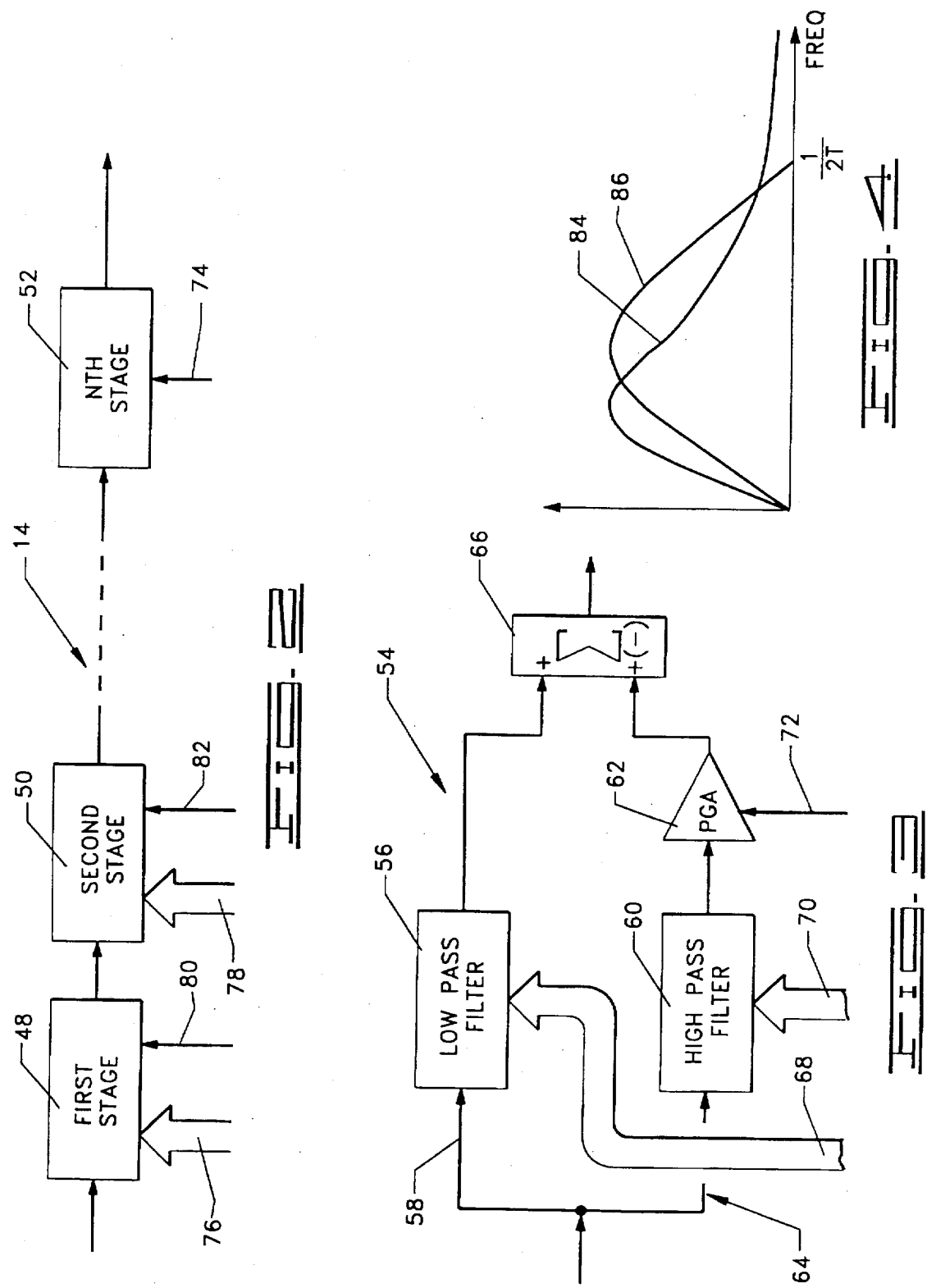

ADAPTIVE ANALOG TRANSVERSAL EQUALIZER

RELATED APPLICATIONS

This application is a continuation-in-part (CIP) of U.S. patent application Ser. No. 08/309,912 now U.S. Pat. No. 5,592,340 entitled DISC DRIVE PRML CHANNEL WITH ADAPTIVE ANALOG TRANSVERSAL EQUALIZER, filed Sep. 21, 1994 by the same inventors of the present invention, assigned to the assignee of the present invention and incorporated herein by reference.

BACKGROUND OF THE INVENTION

1. Field of the Invention

The present invention relates generally to improvements in electronic filters, and more particularly, but not by way of limitation, to improvements in electronic filters suitable for use in a disc drive PRML read channel.

2. Discussion

In disc drives used to store computer files, the files are stored along concentric data tracks defined in magnetizable coatings on the surfaces of rotating discs. To this end, write heads are positioned adjacent the disc surfaces and are radially movable to align with a track selected to store a file so that the track can be magnetized by passing a current through the write head. The direction in which the data track is magnetized is determined by the direction of the current through the write head so that a file can be stored by magnetizing the track in a pattern that is derived from the file. More particularly, the write head current is supplied by a write driver to which a sequence of bits derived from the file is clocked and the direction of the current in each clock period is determined by the logic values of bits received by the write driver. Consequently, successive segments of the data track will be magnetized in a pattern that reflects the contents of the file. The magnetized track segments, or data elements, in turn, produce a magnetic field that can be sensed by a read head to generate an electrical signal that varies with time in a way that reflects the sequence of data elements along the data track to permit retrieval of the file.

In a conventional disc drive, the write driver reverses the direction of the current through the write head each time a logical 1 occurs in the sequence of bits received by the write driver to, in turn, reverse the direction of magnetization of the magnetic medium along the track each time a logical 1 occurs in the sequence. During subsequent reading, each reversal in the magnetization of the data track, a so-called flux transition, gives rise to a peak in the signal generated by the read head and peak detection circuitry is used to place the peaks within "read windows" established by a phase locked loop that receives signals from the peak detection circuitry to establish a read clock that is synchronized with the passage of flux transitions by the read head. More particularly, the occurrence of a signal peak within a read window is an indicator of a flux transition along the data track. Consequently, since the flux transitions are generated by logical 1's in the encoded user file, the occurrence of a signal peak indicates a logical 1 in the sequence of data bits that were received by the write driver. The read phase locked loop is then used to clock logical 1's for those read windows in which peaks are detected, and logical 0's for those read windows in which peaks are not detected, to circuitry which regenerates the stored file.

While conventional disc drives which make use of the above scheme are able to operate reliably to store large quantities of data, it has become increasingly difficult to raise the data storage capacity of disc drives of this type to higher and higher levels that are demanded by users of disc drives. More particularly, the data storage capacity of a disc drive depends upon the transfer rate of data bits between the write head and a data track and between the data track and a read head and problems have arisen with increasing the transfer rates of drives of the generic type.

Several effects tend to limit transfer rate in conventional disc drives. The synchronization between the read clock and the passage of flux transitions by the read head depends upon the correspondence between peaks in the signal induced in the read head and passage of individual flux transitions by the read head. However, the magnetic field from which the read head signal is derived is a superposition of the magnetic fields produced by all of the flux transitions on the disc. Consequently, as the transfer rate is increased, to decrease the spacing of flux transitions along a data track, so-called "intersymbol interference", that is, significant superposition of magnetic fields from successive flux transitions on a data track, causes peaks in the read head to be shifted in time from the times that such peaks would occur for an isolated flux transition. While the effects of peak shift can be minimized, for example, by pulse slimming, encoding of user data and prewrite compensation, it remains a problem with peak detect disc drives that limits the transfer rate of data in such a disc drive.

Moreover, the superposition of magnetic fields of successive flux transitions gives rise to a second problem. The fields produced by adjacent flux transitions superpose destructively so that the magnitude of the signal induced in a read head by passage of a flux transition decreases with increasing transfer rate. Consequently, the signal to noise ratio of the output of the read head decreases with increasing transfer rate to increase the number of errors that occur during the reading of data. While, as in the case of peak shift, corrective measures, for example, adaptive signal filtering and the use of error detection and correction circuitry, can be taken, it becomes increasingly difficult to employ these measures as the transfer rate is increased. The net result is that, while room for improvement of disc drives that make use of peak detection circuitry may still exist, the improvements are achieved only by measures that are becoming increasingly difficult and expensive to employ.

Because of this difficulty in increasing the data transfer rate in disc drives employing peak detection in the read channel, practitioners have, in recent years, turned to the use of so-called Partial Response, Maximum Likelihood (PRML) read channels in disc drives. The term "partial response" indicates that the response of a single bit transferred binary information is spread out to adjacent bit intervals; that is, only part of the bit response is inside of the corresponding nominal bit interval. In disc drives of this type, partial response signaling is utilized to control, rather than to suppress, intersymbol interference (ISI) and the effect of noise is minimized by the use of maximum likelihood detection of the magnetization of sequences of segments of the data track. To this end, signals corresponding to individual flux transitions are filtered to a signal which, in the absence of noise, would have a nominal form and the signals are then sampled at times determined in relation to this nominal form for maximum likelihood detection in which each bit of encoded data is recovered in the context of the sequence of bits that were written to the disc to limit the effect of noise.

The use of partial response signaling and maximum likelihood detection in a disc drive places especially stringent requirements on filtering of the signal induced in the read head prior to maximum likelihood detection. To achieve satisfactory results, it will be understood that the filtering must be done in both frequency-domain, to reduce noise, and in the time-domain, to obtain a particular waveform with known and controlled ISI. While maximum likelihood detection limits the effect of random noise in the reading of a block of data from a disc, variances between the nominal form to which signals induced in the read head are ideally filtered and the actual filtered signal constitute systematic noise which can generate errors in the data that is eventually recovered from a data track. Consequently, electronic filtering of the signal induced in the read head plays a very important role in the operation of a disc drive that makes use of PRML.

A complicating factor in the filtering of the signal induced in a disc drive read head to a nominal form is that the form of the signal induced in the particular read head, even disregarding noise, varies from head to head and with the radius of the data track upon which data being read is stored. Such variation, which is related to the increase of track circumference with track radius, arises from the use of the magnetic interaction between the read head and the magnetization of data track that enables the data track to be read and is, consequently, an inherent characteristic of signals induced in a read head.

For economic reasons, obtaining sufficient yields in the manufacturing of disc drives necessitates the allowance of relatively loose tolerances in the variations of head-media components and the ability of the channel electronics to compensate for the effects of these variations. Thus, the filter in a PRML read channel must not only be capable of filtering the signal induced in a read head to a reasonable approximation of a specific wave form but must be able to do so adaptively, and at a low cost.

In the past, the favored approach to effecting the adaptive filtering required in a disc drive that employs partial response signaling and maximum likelihood detection has been to employ digital electronics in the construction of the time-domain filter. Such filters generally contain an analog to digital converter (ADC) that digitizes the signal after partial filtering has taken place and a transversal equalizer that employs registers as delay elements so that filtering can be effected by adding successive sample values with appropriate weighting of the sample values. More particularly, the raw analog signal from the read head, after preliminary frequency-domain filtering (to reduce noise), is sampled and converted to digital form by the ADC which is clocked at the channel bit rate. The ADC provides an input to a conventional digital transversal equalizer that employs a digital delay, such as from the aforementioned shift registers clocked by the same clock. Next, digital signal processing takes place through the addition of successive sample values from cells of the shift register, weighted appropriately by digital multipliers to provide samples of the equalized signal. These samples are then used for data recovery and for self-synchronization. For additional discussion concerning digital transversal equalization, see U.S. Pat. No. 4,146,840 entitled TECHNIQUE FOR OBTAINING SYMBOL TIMING FOR EQUALIZER WEIGHTS issued Mar. 27, 1979 to McRae et al.

However, the use of digital signal processing in such a manner has led to the following problems regarding system performance and economics. Firstly, the digital signal processing and an inherent delay in the transversal equalizer requires at least several additional clock cycles. This introduces additional processing time in the timing circuitry (Phased locked loop, or PLL) that provides the sampling clock for the ADC with the result that time correction is delayed with respect to the times at which samples are taken. Such delay is usually termed "transportation lag" or "dead time" in control theory; see, for example, K. Ogata, "Modern Control Engineering", Prentice-Hall, Englewood Cliff, 1970, pp. 346–350. This dead time adversely affects the stability of the PLL. Consequently, the use of digital filtering requires that compromises be effected between the extent to which filtered digital signals approximate nominal waveforms and the value of allowable delay introduced into the timing circuitry.

The second disadvantage associated with the use of such digital signal processing is related to economic considerations. As required, the transfer rate of channels in disc drives is constantly increasing (200 Mbits/second has been achieved to date), requiring the digital signal processing to be performed at a very high speed. This requires extremely fast and large circuitry with an attendantly large power consumption. As a result, the power consumption in the read channel becomes a limiting factor in low cost, low power, small sized disc drives, making the use of digital signal processing in this filtering at extremely high transfer rates impractical.

These disadvantages arising from digitally filtering PRML channels resulted in attempts to replace digital time-domain filtering with analog time-domain filtering through the use of analog transversal equalizers. For a more detailed discussion of analog transversal equalizers employing ideal delay elements, see A. Gersho, "Adaptive Equalization of Highly Dispersive Channels for Data Transmission", Bell System Technical Journal, Jan. 1969, pp. 55–69, incorporated herein by reference. However, attempts to implement analog transversal equalizers in disc drive read channels have been largely unsuccessful, due to economic impracticalities. As is well known, electric signals propagate at a speed that is close to the speed of light, but known devices (such as analog delay lines) that emulate large programmable signal delays in electric circuits are too expensive and bulky for implementation in low-cost, small sized disc drives.

The problems associated with such prior art analog transversal equalizers are illustrated by U.S. Pat. No. 5,325,130 entitled GHOST CANCELLER, issued Jun. 28, 1994 to R. Miller. This reference describes a programmable analog transversal equalizer for High Definition Digital Television (HDDT) applications. Because of the absence of adequate electric delay elements, the equalizer employs an "exotic" electro-acoustic delay element in order to achieve reasonable performance by the circuit, including uniform delays. While such an approach may be feasible for use in HDDT applications, it is not feasible for implementation into a disc drive read channel due to both size and cost constraints.

SUMMARY OF THE INVENTION

The present invention provides a fully adaptive filtering system which can be employed to filter the signal induced in the read head of a disc drive to as close an approximation of the nominal wave form that is sampled for maximum likelihood detection as desired without introducing problems in the timing of the sampling of the filtered signal. Specifically, the filtering is completed before the signal is sampled so that circuitry that generates clock signals used in the sampling operates with substantially no delay between the generation of the samples and correction of any timing errors that may exist in the sampling. An example of such circuitry is described in U.S. Pat. No. 5,459,757 entitled "TIMING AND GAIN CONTROL CIRCUIT FOR A PRML READ CHANNEL", issued Oct. 17, 1995 to Minuhin et al. the teachings of which are hereby incorporated by reference.

The filtering system of the present invention provides a flexibility in construction that permits the invention to be readily adapted not only to disc drives that make use of various types of read heads, or different classes of partial response signaling, but also to disc drives that operate at various transfer rates or, indeed, at a plurality of transfer rates. It will become clear that significant economic benefits in manufacturing are achieved by utilizing a frequency-domain delay circuit which makes use of adaptive frequency domain filters to provide delayed signals that can be weighted and added to effect final time-domain filtering to the nominal wave form. More particularly, the use of filters as delay elements limits filtering that is effected prior to the generation of the delayed signals and the adaptivity of the filters so used provides a flexibility in filtering of the signal induced in the read head that permits the number of filters to be minimized without loss of capability of the filtering system to achieve an approximation of the nominal wave form for any data track radius and substantially any data transfer rate that will suffice for maximum likelihood detection of the filtered signal to recover data that has been stored to the disc drive.

To these ends, and in one aspect of the present invention, the filtering system of the present invention provides a flexible, robust, low-cost, small-sized, easily manufacturable, analog, adaptive generalized transversal equalizer that is suitable for a programmable adaptation to the desirable signal shape in a low-cost communication channel. As provided hereinbelow, the term "generalized" indicates that the equalizer includes a "generalization" by replacing ideal delay elements with easy to realize, non-ideal LSI (large scale integration) frequency-domain filters having relatively loose tolerances.

The second aspect of the present invention is to provide a filtering system for a PRML channel in a disc drive comprising an adaptive, analog prefilter having a response that varies continuously with the excitation of the prefilter in accordance with a transfer function that is determined by at least one adaptive parameter received by the prefilter in combination with an analog, adaptive generalized transversal equalizer that makes use of serially connected frequency-domain filter sections as the delay circuits which are tapped for addition of weighted sums of delayed signals derived from the signal received by the analog, adaptive generalized transversal equalizer. By the use of analog circuitry to effect the filtering, the filtering is completed before sampling of the signal is effected so that no interference between the filtering of the signal induced in the read head to the nominal wave form and the sampling of the wave form exists. Hence, no limit exists on the degree to which the filter of the present invention may be adapted in relation to the circumstances in which the filter is used. Thus, the filter may be adapted for use with various types of read heads and classes of partial response signaling or used at substantially any transfer rate at any track radius.

In a third aspect of the invention, the filter sections of the delay circuit of the analog, adaptive generalized transversal equalizer are adaptive filters which provide selectable delays to the signal received by the transversal equalizer. Hence, the delays can be optimized experimentally to limit not only the number of filter sections that are needed to achieve a wave form that is sufficiently close to the nominal wave form for effective maximum likelihood detection, but, further, to limit complexity that might otherwise be required of the prefilter.

In yet a fourth aspect of the invention, the filter sections of the analog, adaptive generalized transversal equalizer are low pass filters which enables further simplification of the prefilter. More particularly, in a PRML system, it is contemplated that the spectrum of the pre-filtered signal will have a cutoff frequency at half the sampling rate and the use of low pass filters as the filter sections of the transversal equalizer has the effect of increasing the order of low pass filtering that is effected by the filter system as a whole. Consequently, circuitry that might otherwise be directed toward low pass filtering of the signal induced in the read head can be eliminated or simplified.

An object of the present invention is to provide a filtering system for a PRML read channel that operates independently of circuitry that generates timing signals for the read channel.

Another object of the present invention is to provide a filtering system for a PRML read channel that can be adapted to substantially any type of PRML read channel with which the filtering system might be used.

Yet a further object of the present invention is to provide a filtering system for a PRML read channel that is economical to manufacture.

Still another object of the invention is to limit the complexity of filtering systems utilized in PRML read channels.

Other objects, features and advantages of the present invention will become apparent from the following detailed description when read in conjunction with the drawings and appended claims.

BRIEF DESCRIPTION OF THE DRAWINGS

FIG. 2 is a block diagram of the frequency-domain prefilter of the filtering system shown in FIG. 1.

FIG. 3 is a block diagram of a stage of the prefilter shown in FIG. 2.

FIG. 4 is a graph comparing the spectrum of a typical signal from the read head of a disc drive to the spectrum of a class IV partial response signal.

DESCRIPTION

Figure 1:
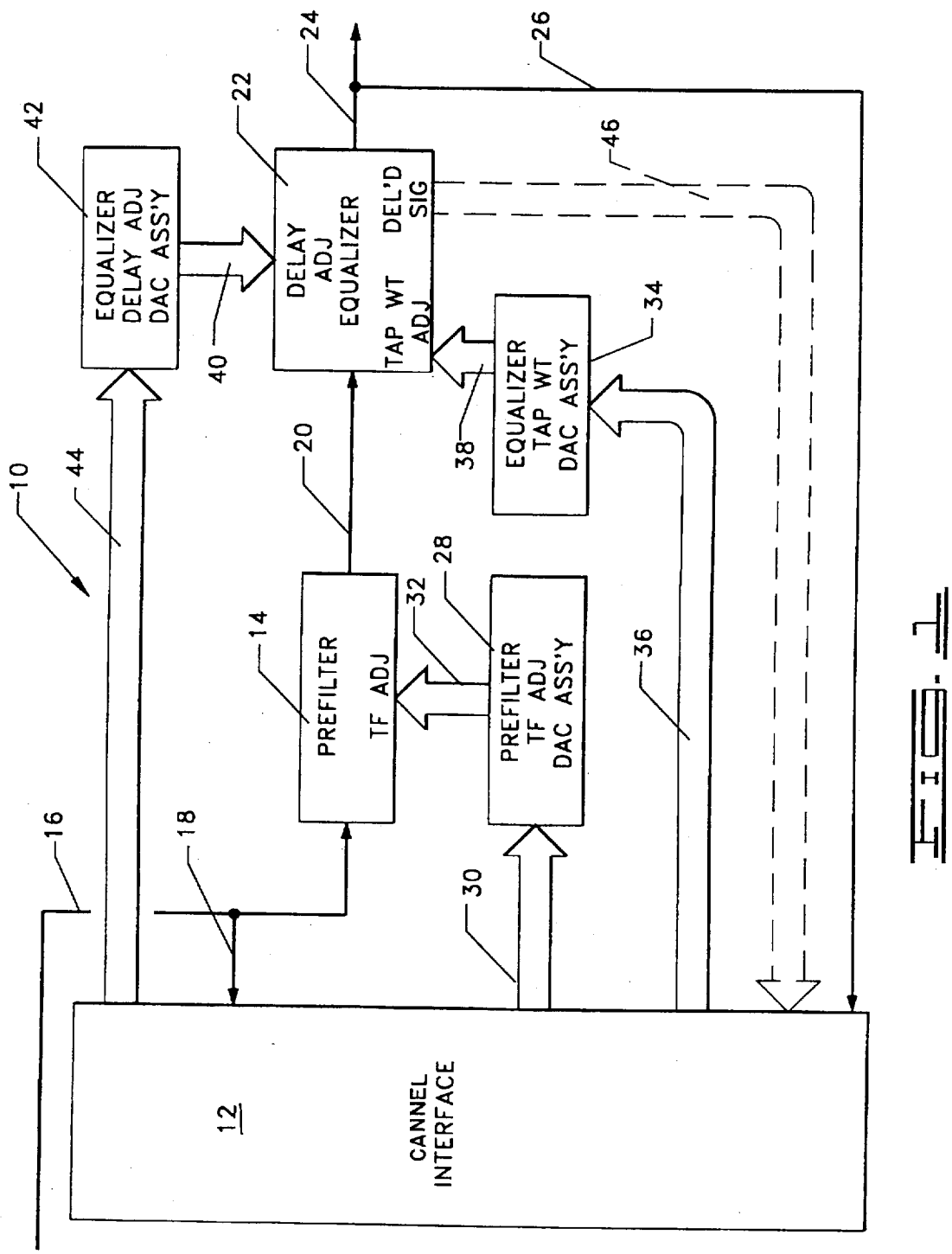
FIG. 1 is a block diagram of a filtering system constructed in accordance with the present invention.

As provided hereinabove, the present invention overcomes the disadvantages of the prior art and provides a programmable (adaptable), low-cost, low-power, small sized, LSI implementable analog, adaptive generalized transversal equalizer generally useful in a communication channel, and more particularly, in a disc drive read/write channel. In the implementation of the preferred embodiment of the present invention, a "generalization" is made in which ideal delay elements of the prior art are replaced with non-ideal, generalized delay elements comprising easy to realize, LSI frequency-domain filters. These generalized delay elements can be allowed to have relatively large tolerances and output response variations, including nonuniform magnitude response, non-linear phase response and significantly variable delay. As explained below, the ability to provide adaptive equalization compensates for the effects from all of these imperfections and variations in the delay elements.

Before discussing the construction and operation of the preferred embodiment of the present invention, a general overview of generalized transversal equalization theory will be discussed. It will be useful to those skilled in the art to compare the following discussion of this theory with the prior art theory presented in the previously incorporated Gersho reference.

The output $Y_n$ (sampled at moments nT) of a generalized transversal equalizer with m taps is the sum of weighted signals from all taps k and given as:

$$Y_n = C_1 X_{1_n} + C_2 X_{2_n} + \ldots C_k X_{k_n} + \ldots + C_m X_{m_n} \quad (1)$$

where $Y_n$ is the output of the equalizer, $X_{kn}$ are the signals at tap k at moments nT and $C_k$ are the coefficients (tap weights) at tap k. It will be noted that T is an arbitrary sampling interval and the tap signals $X_{kn}$ are allowed to have different waveforms for different k (distortions and filtration in non-ideal delay elements), as opposed to Gersho, who provides samples exactly at the bit rate and tap signals that are identical in shape (no distortions and ideal delay).

The sum of squared errors of equalization (error criterion that is identical to the Gersho reference) is provided as: where $d_n$ is the sequence of desired (sampled) values of an ideally equalized output $$\epsilon = \sum_n (Y_n - d_n)^2 \quad (2)$$

signal at moment nT.

The error function (2) is a function of m tap weights and form some continuous surface at an m-dimensional hyperplane. This function has a minimum at the point where all partial derivatives of it relative to tap weights $C_k$:

$$\frac{\partial \epsilon}{\partial C_k} = 2 \sum_n (Y_n - d_n) \frac{\partial Y_n}{\partial C_k} \quad (3)$$

are equal to zeros (substitute $Y_n$ from (1) into (3)).

$$\sum_n (Y_n - d_n) X_{k_n} = 0, \quad 1 \leq K \leq m. \quad (4)$$

Expression (4) is the system of m linear equations for m unknown tap weights $C_k$. Consequently, the solution of these equations results in optimal tap coefficients which yield the least mean square (LMS) error of equalization.

It will be recognized that there are two significant differences between the foregoing discussion and the Gersho reference: Firstly, $X_{kn}$ are allowed to be different for different taps (distortions and filtrations are performed with non-ideal delay elements); and secondly, sampling is performed at arbitrary sampling intervals.

Thus the present discussion is a generalization of the previous art theory and technique, and has practical implications and advantages over the prior art, as will be discussed below.

Equations (4) also have another interpretation; the left-part sides are deterministic cross correlation between equalizer output error sequence $Y_n - d_n$ and tap signal sequences $X_{kn}$. Equations (4) stipulate that these cross correlations must have zero values, which holds therefore, for the generalized case, and not only for the previous art case. Consequently, it provides the leverage for an adaptive solution of the system of linear equations (4) without knowledge of coefficients of the equations. The solution is achieved by an iterative reduction of all cross correlations (equations (4)) to zeros by small changes of the tap weight values.

The described generalized transversal equalization has significant advantage relatively to previous art not only in the cost, size and simplicity, but has better overall performance because it provides an additional signal filtering in the frequency domain (additional suppression of noise in non-ideal delay-filters).

Referring now to the drawings in general and to FIG. 1 in particular, shown therein and designated by the general reference numeral 10 is a block diagram of a filtering system constructed in accordance with the present invention. It is contemplated that the filtering system 10 will be formed on a single silicon chip, with other portions of a PRML read channel (not shown), and will have adaptive features that will be described below. It is further contemplated that, in the implementation of these features, the filtering system 10 will receive digitally expressed, adaptive parameters from a microprocessor (not shown) via a channel interface 12 which is comprised of a plurality of latches (not shown) for storing the parameters. These parameters will be discussed below.

Similarly, it is contemplated that the adaptation of the filtering system 10 may be carried out at the time that a disc drive employing the PRML read channel of which the filtering system 10 is a part is manufactured and that such adaptation will include the measurement of signals at various locations on the filtering system 10. Thus, the channel interface 12 may further include electrical connectors (not shown) to which external equipment can be connected for the measurement of these signals.

As shown in FIG. 1, the filtering system 10 is generally comprised of an adaptive, analog prefilter 14 which receives the signal to be filtered on a signal path 16 from a programmable gain amplifier (not shown) which is formed on the same chip as the filtering system 10 and, like the filter system 10, is a portion of a PRML read channel for a disc drive. For purposes to be discussed below, the unfiltered signal on the signal path 16 is also provided to the channel interface 12, via a signal path 18, for transmittal to external equipment utilized in the adaptation of the filter system 10.

The output of the prefilter 14 is transmitted via a signal path 20 to the input of an analog, generalized adaptive transversal equalizer 22 and the transversal equalizer 22 provides the filtered signal to samplers (not shown) which may be part of a timing and gain control circuit, as described in the previously incorporated Minuhin et al. reference U.S. Pat. No. 5,459,757, formed on the same chip via a signal path 24. The filtered signal may be also transmitted to an electrical connector (not shown) in the channel interface 12 via a signal path 26 for a purpose to be described below.

As has been noted above, both the prefilter 14 and the transversal equalizer 22 are adaptive so that their filtering characteristics can be adjusted via adaptive parameters provided by a microprocessor. It is contemplated that these parameters will be expressed as analog signals at the prefilter 14 and transversal equalizer 22 and digital to analog converter assemblies are provided to convert the binary expressions of these parameters, by means of which they are stored in the microprocessor and outputted to latches in the channel interface 12, to analog parameter signals for use by the prefilter 14 and transversal equalizer 22.

In particular, the filtering system 10 is comprised of a prefilter transfer function adjustment DAC assembly 28 which includes a plurality of digital to analog converters that receive binarily expressed adaptive parameters from the channel interface 12 via a bus 30 and output analog adaptive parameter signals that express the parameters to the prefilter 14 on signal paths that have been collectively indicated as a bus 32 in FIG. 1. For the preferred embodiment of the prefilter 14 to be discussed below, the adaptive parameter signals outputted by the DAC assembly 28 are electrical currents having magnitudes determined by binary values received by the DAC assembly 28. Similarly, digitally expressed tap weights are provided to a plurality of digital to analog converters (not shown) in an equalizer tap weight DAC assembly 34 on a bus 36 from the channel interface 12, converted to analog signals in the DAC assembly 34, and transmitted to the transversal equalizer 22 via a plurality of signal paths collectively indicated by an analog bus 38 in FIG. 1. As will be discussed below, the transversal equalizer 22 is comprised of a plurality of adaptive filter sections. Analog signals used to adjust the characteristics of these filter sections are received by the transversal equalizer 22 on a plurality of signal paths collectively indicated as an analog bus 40 in FIG. 1 from an equalizer delay adjust DAC assembly 42. Digital expressions of these signals are provided to the DAC assembly 42 via a bus 44.

As will also be discussed below, the filter section of the transversal equalizer 22 generate signals that are delayed in time with respect to signals these sections receive and these delayed signals can be transmitted to the channel interface 12 via a plurality of signal paths, collectively indicated as a bus 46 in FIG. 1, for measurement by off chip apparatus connected to the channel interface 12.

Referring now to FIGS. 2 and 3, shown therein is the construction of the prefilter 14 of the present invention. As shown in FIG. 2, the prefilter is comprised of a plurality of serially connected stages, three of which have been illustrated and designated by the numerals 48, 50 and 52 therein. In a preferred embodiment of the invention, adapted for use in a disc drive that employs class IV partial response signaling, a convenient number of stages for the prefilter 14 is five; however, it will be recognized by those of skill in the art that a different number of stages might be used. In particular, the present invention contemplates that the number of stages of the prefilter 14 and the construction of each stage can be varied to adapt the prefilter 14 to the disc drive in which the filtering system 10 is to be used. Thus, for example, the number of stages and the construction of each stage can be varied to take into account differences in the signals induced in read heads of different types that might be included in a disc drive or to adapt the prefilter 14 to the use of various classes of partial response signaling that might be used in a disc drive.

A preferred construction for selected ones of the stages of the prefilter 14 has been illustrated in FIG. 3 in which such stage has been designated by the general reference numeral 54. As shown therein, the stage 54 is comprised of a linear phase, analog, low pass filter 56 in one branch 58 of the stage 54 and a linear phase, analog, high pass filter 60 connected in series with a programmable gain amplifier 62 in a second branch 64 that is connected in parallel with the branch 58. The inputs of the filters 56 and 60 are connected together to receive the signal at the input of the stage 54 and the outputs of the low pass filter 56 and programmable gain amplifier 62 are added or subtracted by a summing circuit 66 to provide the response of the stage 54.

In the preferred embodiment of the prefilter 14 referred to above, the filters 56 and 60 of the first four stages of the prefilter 14 are second order filters having linear phase characteristics so that each of these stages can decrease the magnitude of the signal received by the prefilter 14 in a selected frequency range by addition of the outputs of the low pass filter 56 and the programmable gain amplifier 62 or can increase the magnitude of such signal, again in a selected frequency range, by subtracting of the output of the programmable gain amplifier 62 from the output of the low pass filter 56 in such stages.

It is further contemplated that the low pass filter 56 and high pass filter 60 of each stage 54 are adaptive filters having transfer functions that can be adjusted in response to adaptive parameter signals received on analog buses 68 and 70, respectively, that form a part of the bus 32 of FIG. 1. Filters having this capability have been described in U.S. Pat. No. 5,392,171 entitled FULLY INTEGRATED PROGRAMMABLE FILTERS FOR DISC DRIVE SUBSYSTEMS, issued Feb. 1, 1995 to Kovner, Minuhin and Srinivasan, assigned to the assignee of the present invention and incorporated herein by reference, as well as in the article: "Active Filter Design Using Operational Transconductance Amplifiers; A Tutorial", R. L. Geiger and E. Sanchez-Sinencio, IEEE Circuits and Devices Magazine, Volume 1, Number 2, March 1985. As disclosed in the article, the gain of an operational transconductance amplifier can be adjusted by an electrical current received by the amplifier and such characteristics can be utilized to construct filters, a number of which are illustrated in the article, for which the coefficients of frequency in the transfer functions of such filters can be adjusted by currents supplied to the operational transconductance amplifiers.

The programmable gain amplifier 62, which can also be constructed using operational transconductance amplifiers, similarly receives at least one adaptive parameter signal on a signal path 72 that forms a portion of the bus 30 of FIG. 1, to adjust the relative amplitudes of signals within the pass bands of the filters 56 and 60. Consequently, portions of the spectrum of a signal received by the stage 54 can be enhanced or attenuated by amounts selected by the programmable gain amplifier 62.

The final stage of the preferred embodiment noted above is a first order, adaptive low pass filter whose transfer function can similarly be adjusted in response to a current received by such stage on a signal path 74 (FIG. 2) in response to an adaptive parameter outputted by a microprocessor to the prefilter transfer function DAC assembly 28 shown in FIG. 1. Consequently, the transfer function of the prefilter 14 can be adjusted by currents supplied to the stages of the prefilter 14 on analog buses indicated at 76 and 78 in FIG. 2 to adjust the transfer functions of high and low pass filters included in such stages, by currents supplied to stages of the prefilter 14 on analog signal paths indicated for two stages at 80 and 82 in FIG. 2 to adjust the relative amplitudes of the high and low frequency responses of these stages, and by a current supplied to the last stage via the analog signal path 74 to adjust the transfer function of the last stage of the prefilter 14.

The purpose of providing the prefilter 14 with adaptive characteristics can best be understood with respect to signal characteristics that have been illustrated in FIG. 4. Shown therein is a graph 84 of the magnitude characteristic of the signal induced in a typical thin film read head by passage of an isolated magnetization pulse on a data track by the read head as a function of frequency. In general, and as shown, such characteristic rises rapidly from zero at zero frequency and then drops generally toward zero at higher frequencies. By contrast, the use of partial response signaling in the read channel of a disc drive assumes that the spectrum of the signal arising from an isolated magnetization pulse, that is, the signal which is sampled, will have a specific form which depends upon the class of partial response signaling that is employed in the disc drive. For example, where class IV partial response signaling is used in a disc drive, the wave form that is to be sampled is required to have a spectrum generally illustrated by curve 86 in FIG. 4 in which T is the time between successive samples. For such class of signaling, it can be seen that the signal induced in the read head generally exhibits greater than desired magnitude characteristics at low frequencies and smaller than desired magnitude characteristics at higher frequencies. Moreover, the spectrum of the signal induced in the head includes high frequency components that extend beyond the cutoff frequency for class IV partial response signaling.

The purpose of the filtering system 10 is to process the signal issuing from the read head to as close an approximation of the wave form for the selected class of partial response signaling that is to be used in the read channel of a disc drive and the invention contemplates that such processing will be carried out in part by the prefilter 14. Specifically, it is contemplated that the prefilter 14 will generally provide a low frequency notch, a boost at higher frequencies and a large attenuation above the partial response signal cut off frequency to adjust the gross magnitude characteristics of the signal. The time-shaping of the signal to a close approximation of the desired signal wave form is then carried out using the transversal equalizer 22 that has been more particularly illustrated in FIG. 5.

Figure 5:
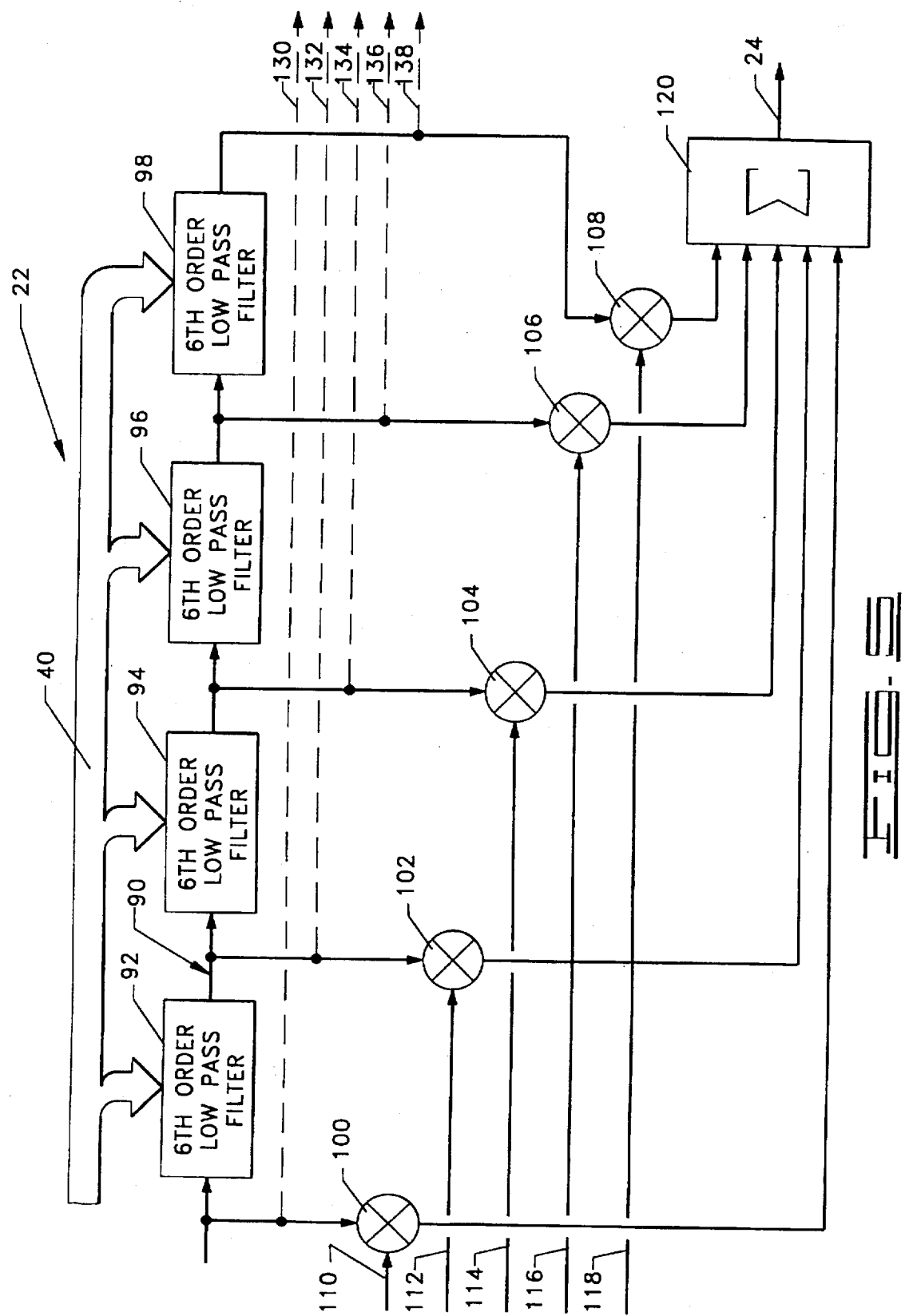
FIG. 5 is a block diagram of the generalized transversal equalizer of the filtering system shown in FIG. 1.

Referring to FIG. 5, the analog, adaptive generalized transversal equalizer 22 of the present invention is comprised of a delay circuit generally indicated at 90 that is comprised of a series of analog frequency-domain filter sections 92, 94, 96 and 98 that each provide a continuous response to a continuous excitation that, further, is delayed in time with respect to the excitation by an amount that depends upon the transfer function of each filter section. The delay circuit 90 is tapped at the input to the filter section 92, at the output of the filter section 98 and between each pair of filter sections 92, 94, 96 and 98 and the signals at the tap locations are transmitted to analog multipliers 100, 102, 104, 106 and 108 as illustrated in FIG. 5.

The coefficients of multiplication of the multipliers 100, 102, 104, 106 and 108 are determinable by analog tap weight signals received on signal paths 110, 112, 114, 116 and 118 respectively, forming the bus 38 in FIG. 1, so that the responses of the multipliers 100, 102, 104, 106 and 108 are signals having amplitudes that are multiples of signals at the tap locations and the tap weights received from a microprocessor via the channel interface 12 and the equalizer tap weight DAC assembly 34. The multipliers 100, 102, 104, 106 and 108 are preferably Gilbert cell multipliers. In such case, the tap weights expressed digitally in the channel interface 12 will be converted to analog signals by the transversal equalizer tap weight DAC assembly 34 of FIG. 1.

Thus, the outputs of the variable gain multipliers 100, 102, 104, 106 and 108 are received by an analog summing circuit 120 which provides the response of the filtering system 10 to the signal received from the read head (via a variable gain amplifier, not shown) on the signal path 16 of FIG. 1.

While the filtering system 10 as so far described provides a circuit for achieving the partial response signal wave form to be sampled in a disc drive for maximum likelihood detection, the filtering system 10 is comprised of additional features which are used to optimize the construction and capabilities of the filtering system 10. One such feature is the use of adaptive frequency-domain filters for the filter sections 92, 94, 96 and 98, as shown in FIG. 5. More particularly, the present invention contemplates that the filter sections 92, 94, 96 and 98 may be constructed using operational transconductance amplifiers so that the transfer functions of the filter sections 92, 94, 96 and 98, can be adjusted in relation to currents received from the transversal equalizer delay adjust DAC assembly 42 via the analog bus 40 of FIG. 1 that has been carried into FIG. 5. As indicated by the use of a single bus, it is preferable that the filter sections 92, 94, 96 and 98 be simultaneously adjustable using a single DAC that provides signals to all of the filter sections 92, 94, 96, and 98 to limit the time required for determining the adaptive parameters used to adjust the filtering system 10. However, the invention contemplates that separate adjustment of the filter sections 92, 94, 96 and 98 can be effected. In particular, should the type of read head or choice of partial response signaling to be used in a disc drive make it advantageous to use separate adaptation of the filter sections 92, 94, 96 and 98, such separate adaptation can be readily effected utilizing the methods for selecting filter parameters that will be discussed below. Thus, in contrast to prior art transversal equalizers, delay times provided by the filter sections 92, 94, 96, and 98 are continuously variable to enable the composite signal at the output of the summing circuit 120 to be comprised of weighted sums of signals that are delayed by whatever times will yield the closest approximation to the nominal wave form to which signals induced in the read head are to be filtered. Additionally, the adaptivity of the filter sections 92, 94, 96 and 98 eliminates any requirement for exceptional manufacturing tolerances that might otherwise be necessary for the filtering system 10 to accomplish the results for which it is designed.

A second feature of the filtering system 10 in general, and the transversal equalizer 22 in particular, is that the filter sections are low pass filters; for example, sixth order low pass filters in the one preferred embodiment of the invention noted above. Thus, the filter sections 92, 94, 96 and 98 will contribute to the desired attenuation of high frequency components of the signal induced in the read head to minimize the requirements placed on the prefilter 14 to enable further economies in the manufacture of the filtering system 10.

An optional feature of the filtering system 10 is the inclusion of electrical connectors in the channel interface 12 providing access to the tap locations of the transversal equalizer 22. If such feature is used, the access is provided by signal paths 130, 132, 134, 136 and 138, comprising the bus 46 in FIG. 1, that connect to the inputs of the multipliers 100, 102, 104, 106 and 108. Such feature has the advantage of expediting the determination of adaptive parameters for the filtering system 10 but requires additional connections to the chip upon which the filtering system 10 is formed. Accordingly, the determination of adaptive parameters for the case in which the access to the tap locations is not provided for external equipment will be discussed below.

DETERMINATION OF THE ADAPTIVE PARAMETERS

Before discussing the manner in which adaptive parameters are determined for adjusting the tap weights of the generalized transversal equalizer 22 and the transfer functions of the stages of the prefilter 14 and the delay sections of the generalized transversal equalizer 22, it will be useful to briefly discuss the use of the filtering system 10 in a disc drive that includes a PRML read channel of which the filtering system is a part. As noted above, the purpose of the filter system is to process the signal induced in a read head to a nominal wave form which can be sampled for maximum likelihood detection.

In the present invention, it is contemplated that the transfer rate may be varied across the disc surface employing methods that have been described in U.S. Pat. No. 4,799,112 issued Jan. 17, 1989 to Bremmer et al. and in U.S. Pat. No. 5,087,992 issued Feb. 11, 1992 to Dahandeh et al. to permit maximization of the capacity of data stored in a disc drive that makes use of the present invention. Consequently, the adaptive parameters are determined not only to adjust the filtering system 10 to compensate for variations in the spectrum of the signal induced in the read head with data track radius but to enable the filtering system 10 to be adjusted for the variation of transfer rate across the disc. Once the adaptive parameters are determined, they may be stored on special tracks on one or more discs of the disc drive for reading and subsequent use during start up of the disc drive.

Figure 6:
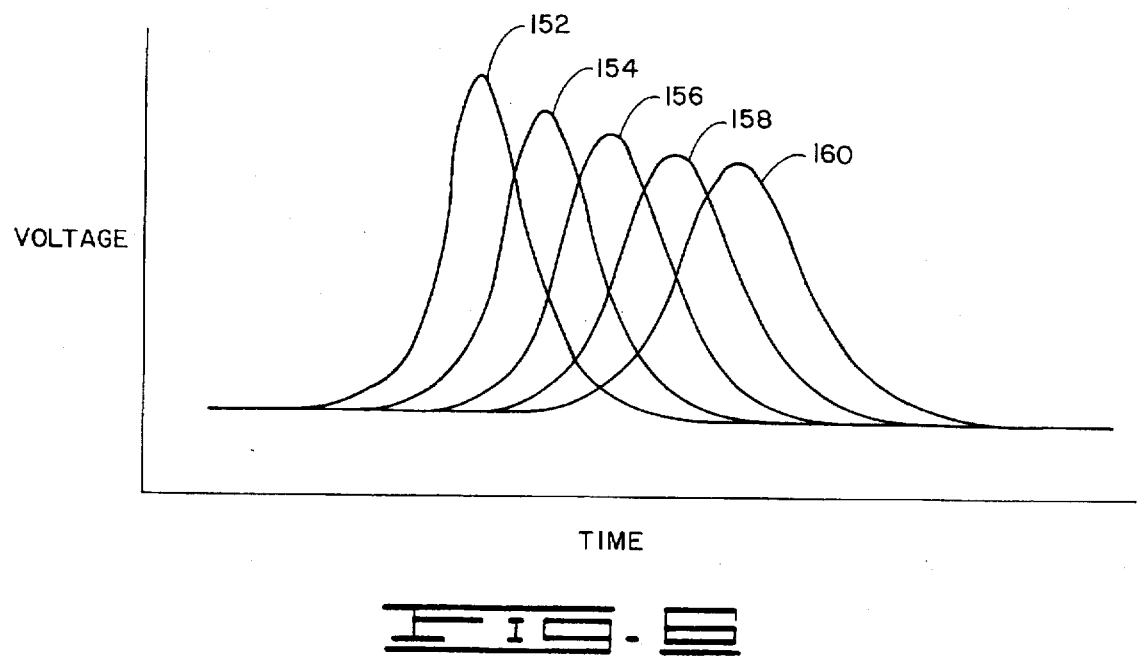
FIG. 6 provides a graphical representation of signals obtained at the five taps of the analog generalized transversal equalizer referenced in FIG. 5.

As provided hereinabove, the delay elements of the analog, adaptive generalized transversal equalizer 22 shown in FIG. 5 comprise frequency-domain filter sections 92 through 98, which may have significant variations in operating characteristics. By way of illustration, FIG. 6 shows a graphical representation of analog signal pulses obtained from the taps of the filter elements 92 through 98 of FIG. 5. More particularly, analog signal pulse 152 from FIG. 6 represents the first tap signal, or a pulse from input signal path 20 (as shown in FIG. 1) to the first delay filter section 92 (of FIG. 5). The subsequent analog signal pulses 154, 156, 158 and 160, respectively, illustrate the distortions that occur in the analog signal pulse 152 as a result of the propagation through the non-ideal delay filter sections 92 through 98. As shown in FIG. 6, significant distortions in the signal shape, including magnitude and phase distortions, result as the pulse propagates through these non-ideal delay elements. Of course, the present invention allows the use of such non-ideal delay elements in the generalized transversal equalizer circuit and compensates for these distortions to provide precise, time-domain filtering for the PRML read channel.

In accordance with the description of the construction and operation of the circuit of FIG. 5 provided hereinabove, the pulses shown in FIG. 6 are provided to the Gilbert cell multipliers 100, 102, 104, 106 and 108, respectively. The corresponding five control inputs on signal paths 110, 112, 114, 116 and 118 provide the coefficients of multiplication to the multipliers in order to facilitate either one-time adaptation (such as during disc drive manufacturing) or real-time, continuous adaptation as data is read from a disc.

During one-time adaptation, the generalized transversal equalizer 22 is initially adapted to provide a desired output signal shape in response to a specified input pulse or sequence of pulses. Particularly, FIG. 7 provides a simplified flow diagram illustrating the steps performed during such an off-line, one-time adaptation of the circuit.

Figure 7:
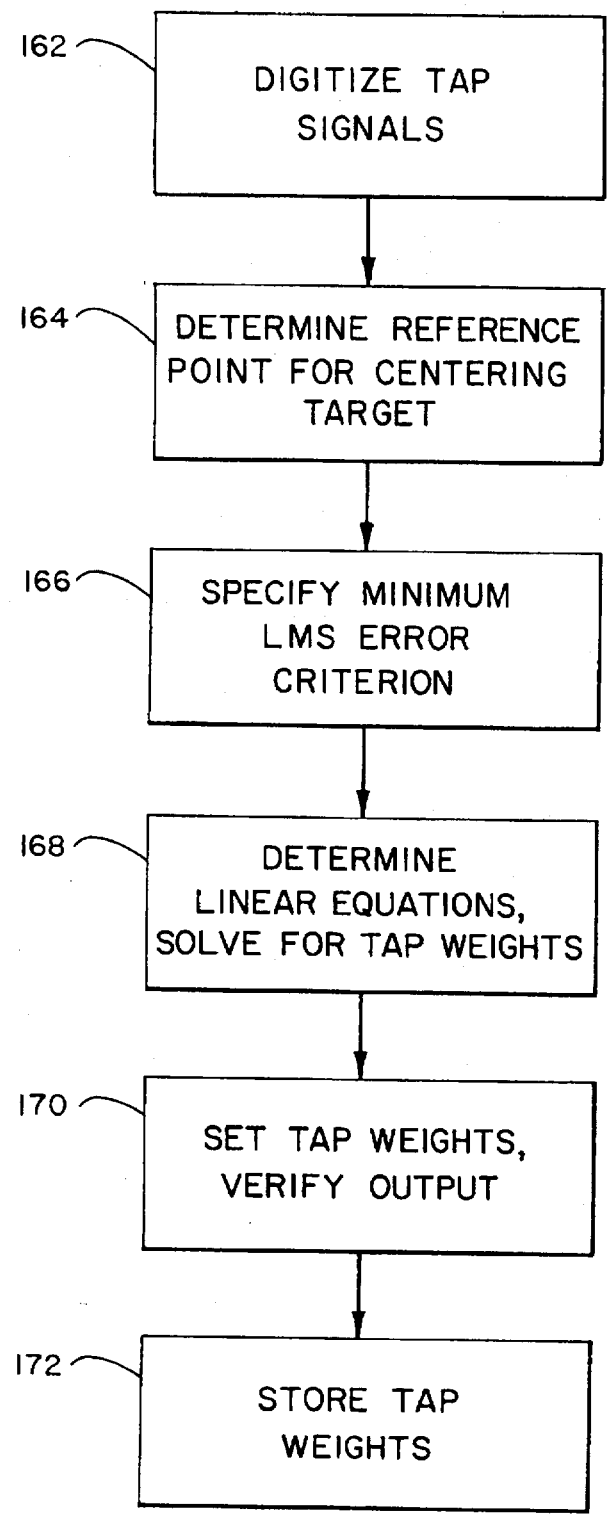
FIG. 7 provides a flow diagram showing a series of steps for performing equalization of a PRML read channel for the case of one-time, off-line adaptation during disc drive manufacturing in accordance with the present invention.

FIG. 7 shows the general process flow for this one-time adaptation, which begins at block 162, wherein the tap signals from the transversal equalizer 22 are digitized. More particularly, test equipment external to the disc drive (such as an oversampling digitizer having a sampling rate much higher than the PRML channel in the disc drive) is used to sequentially digitize all the tap signals, using a common synchronization point and predetermined injected test pulse or sequence of pulses. During this digitization, the outputs of the multipliers (100, 102, 104, 106 and 108 of FIG. 5) are all set to zero, except for the multiplier corresponding to the tap being measured, which is set to maximum.

Once the tap signals have been digitized at block 162, the flow continues to block 164, wherein a time reference corresponding to the maximum energy of a signal at the center tap of the equalizer is determined. This time reference is used as a reference point to center a target type signal such as a class PR-4 signal (whether a single pulse or a special sequence thereof). Once this reference point is determined, the process flow is shown to continue to block 166, wherein a minimum LMS error criterion is specified. More particularly, block 166 entails specifying minimum LMS error between a centered target shape (see "$d_n$" terms in equation (2) above) and an actual output equalized signal, at moments corresponding to the channel data rate sampling points.

Block 168 shows that, once the LMS error criterion is specified, the optimal tap weights are determined from a series of linear equations (see equations (4) above). It will be recognized that the linear equations (equations (4) above) that describe the behavior of the generalized transversal equalizer are different, and more complex, than for transversal equalizers of the prior art, and the oversampling provided by block 162 (of FIG. 7) is necessary in determining the coefficients for these linear equations.

An important distinction of the generalized transversal equalizer case is that no assumptions are made about the values of delay in the generalized delay elements; instead, reliance is made upon the actual dam obtained from the tap signals in order to determine the appropriate tap weights. Further, it has been found that the generalized transversal equalizer 22 of the present invention can accommodate relatively large amounts of delay variations (up to ±50% of the bit delay in a PRML read channel).

Once the tap weights are identified, the flow of FIG. 7 continues at block 170, wherein the tap weights are set and thereafter, signals are passed through the transversal equalizer 22 in order to verify correct performance of the circuit; that is, to determine whether the obtained tap weights result in the appropriate time-domain filtering of the input pulses. If desired, the actual equalized, filtered pulse can be compared to a target pulse to determine whether the equalization falls within acceptable limits. If the tap weights are found to be correct, the tap weights are then stored by the disc drive, as shown by block 172. Otherwise, it may be necessary to change parameters of the prefilter 14 (of FIG. 1) to achieve satisfactory equalization.

Figure 8:
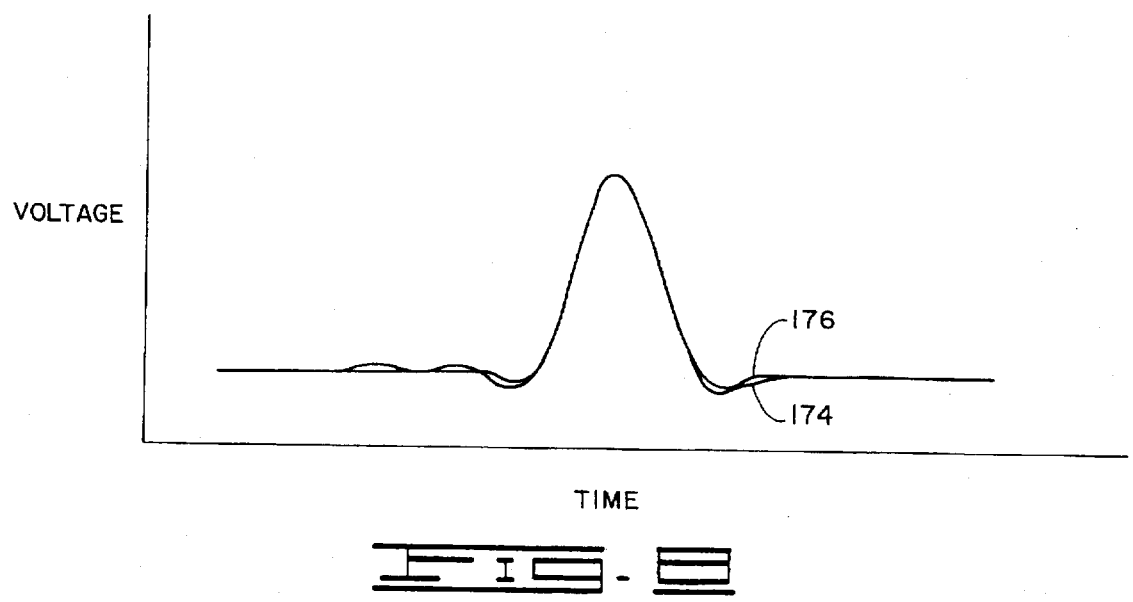
FIG. 8 provides a graphical representation of a desired target pulse and an equalized pulse achieved using the equalizer of FIG. 5 and the series of steps of FIG. 7.

Referring to FIG. 8, shown therein are graphical representations of an equalized, filtered pulse 174 obtained from block 170 of the flow of FIG. 7, as well as a target pulse 176. As shown in FIG. 8, the equalized, filtered pulse 174 agrees very well with the target pulse 176, even with the use of non-ideal delay elements in the transversal equalizer 22 having distorted responses as shown in FIG. 6. More particularly, a review of FIGS. 6 and 8 demonstrate the differences between a conventional analog transversal equalizer of the prior art and the generalized transversal equalizer of the present invention. That is, as provided above, the prior art required the use of precise, near-ideal delay elements in order to provide effective equalization, but the preferred embodiment of the present invention, as demonstrated by FIGS. 6 and 8, can provide excellent time-domain filtering using non-ideal delay elements.

Having concluded a review of off-line, one-time adaptation, it will be recognized that there are other modes of adaptation that may be used, including real-time adaptation in a PRML read channel of a disc drive. Generally, it will be recognized that in the majority of practical systems, a basic LMS error criterion approach may be used in various mode modifications and combinations, including "blind" LMS equalization (on the data), LMS equalization based upon training patterns, and various sign-LMS equalizations. However, the following description provides a generalized view of real-time adaptive equalization that may be used with the preferred embodiment of the present invention, as presented above.

As provided in the Gersho reference, the prior art analog adaptive transversal equalizer employs ideal delays, adaptive real-time equalization, and a sampling rate in a communication channel that is equal to the channel bit rate. Performing an adaptive, real-time time-domain equalization for such a system, according to the Gersho reference, comprises finding an iterative solution to a system of linear equations that govern the behavior of the equalizer, without requiring knowledge of the coefficients of the underlying equations. All that is necessary is to reduce to zeros (iteratively) all the crosscorrelations between the values of the equalization error at the equalizer output and the values of the tap signals at sampling moments.

Therefore, if the output on signal path 24 of the generalized transversal equalizer 22 of FIG. 5 is sampled at the bit rate and the average delay of the non-ideal delay filter sections 92 through 98 is equal to the bit interval, then the same iterative approach may be used with the generalized transversal equalizer 22 to perform real-time adaptation. Thus, in order to effectively implement real-time adaptation with the generalized transversal equalizer 22 at the bit-rate sampling, it may be desirable (comparatively to the one-time, off-line adaptation) to maintain the tolerances on the average value of the delays in the filter sections 92 through 98 as to keep it equal to one bit interval and relatively constant during disc drive operations. In all other respects, the filter sections 92 through 98 may still exhibit widely imperfect response characteristics.

It will be clear that the present invention is well adapted to carry out the objects and attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. An analog, adaptive generalized transversal equalizer, comprising:

adaptive parameter signal means for providing an adaptive parameter signal indicative of a desired transversal equalizer frequency-domain response;

a delay circuit comprising a plurality of serially connected analog frequency-domain filter sections, wherein each filter section is characterized in that the response of the filter section varies continuously in relation to the excitation of the filter section in accordance with a transfer function determined by the adaptive parameter signal;

tap weight signal means for providing tap weight signals;

a plurality of analog multipliers having control inputs, the multipliers connected to selected tap locations of the delay circuit, whereby the outputs of the multipliers are signals having amplitudes that are multiples of the amplitudes of signals at said tap locations determined in relation to the tap weight signals received by the control inputs of the multipliers; and analog summing means connected to the multipliers for adding the outputs of the multipliers.

2. The analog, adaptive generalized transversal equalizer of claim 1, wherein the frequency domain filters are low-pass filters.

3. An analog, adaptive transversal equalizer for a disc drive PRML read channel, comprising:

a delay circuit comprising a plurality of serially connected analog filters, the delay circuit having a plurality of tap locations, each tap location providing a filtered output, wherein the frequency response of each analog filter is determined by an adaptive parameter signal;

a plurality of analog multipliers having control inputs, each analog multiplier connected to a corresponding tap location and providing a multiplied output by multiplying the filtered output with a tap weight signal provided to the multiplier control input; and an analog summer, responsive to the analog multipliers, for summing the multiplied outputs from the analog multipliers.

4. The analog transversal equalizer of claim 3, wherein the frequency domain filters are low-pass filters.

5. In a communication channel of the type employing partial response, maximum likelihood detection on an input signal, an improved transversal equalizer comprising:

adaptive parameter signal means for providing an adaptive parameter signal;

a plurality of serially connected analog filter sections, responsive to the adaptive parameter signal means, for generating a plurality of sequentially filtered and delayed signals in response to the input signal, wherein each of the analog filter sections includes adaptive filter means for performing adaptive frequency-domain filtering in response to the adaptive parameter signal;

tap weight signal means for providing a tap weight signal;

multiplication means, responsive to the analog filter sections and the tap weight signal means, for multiplying the sequentially filtered and delayed signals by the tap weight signal to provide output product signals; and summation means, responsive to the multiplication means, for summing the output product signals.

6. The improved transversal equalizer of claim 5, wherein the analog filter sections are further characterized as low-pass filters.

7. A method for equalizing an input signal in a communications channel, characterized as comprising the steps of:

providing an adaptive parameter signal;

sequentially filtering the input signal in a plurality of serially connected analog filter sections, wherein each analog filter section filters the input section in accordance with a transfer function determined in accordance with the adaptive parameter signal;

providing tap signals from tap locations between adjacent analog filter sections;

providing tap weight signals corresponding to each of the tap locations;

multiplying the tap signals by the respective tap weight signals to generate multiplied output signals; and summing the multiplied output signals to provide an equalized, output signal; wherein the adaptive parameter signal controls the desired time delays of the analog filter sections.

8. The method of claim 7, wherein the step of sequentially filtering the input signal is characterized as comprising the use of low-pass filters for the analog filter sections.

* * * * *

UNITED STATES PATENT AND TRADEMARK OFFICE
CERTIFICATE OF CORRECTION

PATENT NO. : 5,682,125
DATED : October 28, 1997
INVENTOR(S) : Minuhin, et. al.

It is certified that error appears in the above-identified patent and that said Letters Patent is hereby corrected as shown below:

Column 2, Line 1, delete "dam" and insert --data--.

Column 4, line 5, delete "Modem" and insert --Modern--.

Signed and Sealed this

Third Day of August, 1999

Attest:

Q. TODD DICKINSON

*Attesting Officer*     *Acting Commissioner of Patents and Trademarks*